(12) United States Patent
Hwang

(10) Patent No.: US 8,390,096 B2
(45) Date of Patent: Mar. 5, 2013

(54) ADJUSTABLE HOLDING VOLTAGE ESD PROTECTION DEVICE

(75) Inventor: Hsin-Yen Hwang, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 297 days.

(21) Appl. No.: 12/952,641

(22) Filed: Nov. 23, 2010

(65) Prior Publication Data

US 2012/0119330 A1    May 17, 2012

Related U.S. Application Data

(60) Provisional application No. 61/414,319, filed on Nov. 16, 2010.

(51) Int. Cl.
*H01L 29/66*    (2006.01)

(52) U.S. Cl. .. 257/565; 257/566; 257/591; 257/E27.053

(58) Field of Classification Search .................. 257/565, 257/566, 591, E27.053
See application file for complete search history.

(56) References Cited

U.S. PATENT DOCUMENTS

| | | | |
|---|---|---|---|
| 7,205,611 B2 * | 4/2007 | Honjoh et al. ................. | 257/355 |
| 7,274,252 B2 * | 9/2007 | Pujol et al. ..................... | 327/563 |
| 2007/0290266 A1 * | 12/2007 | Ker et al. ....................... | 257/355 |
| 2010/0320501 A1 * | 12/2010 | Gendron et al. .............. | 257/173 |

* cited by examiner

*Primary Examiner* — Trung Q Dang
(74) *Attorney, Agent, or Firm* — Slater & Matsil, L.L.P.

(57) ABSTRACT

An electrostatic discharge (ESD) protection structure comprises a bipolar PNP transistor having an emitter formed by a first high voltage P type implanted region disposed underneath a first P+ region and a collector formed by a second high voltage P type implanted region disposed underneath a second P+ region. The ESD protection structure can have an adjustable threshold voltage by controlling the distance between the first high voltage P type implanted region and the second high voltage P type implanted region. Based upon a basic ESD protection structure, the ESD protection device can provide a reliable ESD protection for semiconductor devices having different voltage ratings.

20 Claims, 9 Drawing Sheets

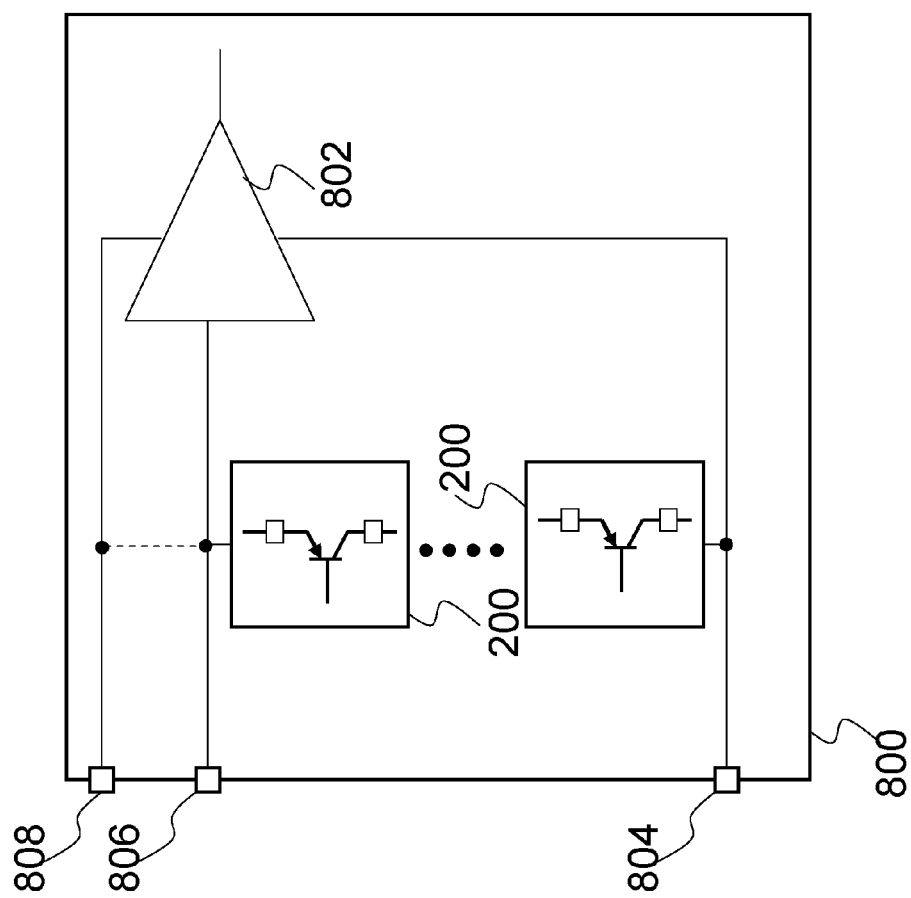

US 8,390,096 B2

ADJUSTABLE HOLDING VOLTAGE ESD PROTECTION DEVICE

This application claims the benefit of U.S. Provisional Application No. 61/414,319, filed on Nov. 16, 2010, entitled "Adjustable Holding Voltage ESD Protection Device", which application is hereby incorporated herein by reference.

BACKGROUND

Electrostatic Discharge (ESD) is a rapid discharge that flows between two objects due to the built-up of static charge. ESD may destroy semiconductor devices because the rapid discharge can produce a relatively large current. In order to reduce the semiconductor failures due to ESD, ESD protection circuits have been developed to provide a current discharge path. When an ESD event occurs, the discharge current is conducted through the discharge path without going through the internal circuits to be protected.

In the semiconductor technology, NMOS transistors, Silicon-Controlled Rectifiers (SCRs) and RC triggered PMOS transistors are widely used. However, with the advance of submicron semiconductor processes, the existing ESD protection solutions may not meet the ever-increasing requirements from the semiconductor industry. For example, in a high voltage application, SCR or NMOS based ESD protection circuits may cause a latch-up failure because the holding voltage is not high enough. On the other hand, despite having a relatively high holding voltage, a RC triggered PMOS transistor may consume a large die area. Furthermore, a variety of applications require different ESD protection holding voltages. The existing ESD solutions may not provide various ESD protection holding voltages based upon a basic ESD protection structure.

BRIEF DESCRIPTION OF THE DRAWINGS

For a more complete understanding of the present invention, and the advantages thereof, reference is now made to the following descriptions taken in conjunction with the accompanying drawings, in which:

FIG. 9 illustrates a further ESD protection scheme by employing a plurality of ESD protection circuits in series connection between an I/O pad and a VSS pad.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
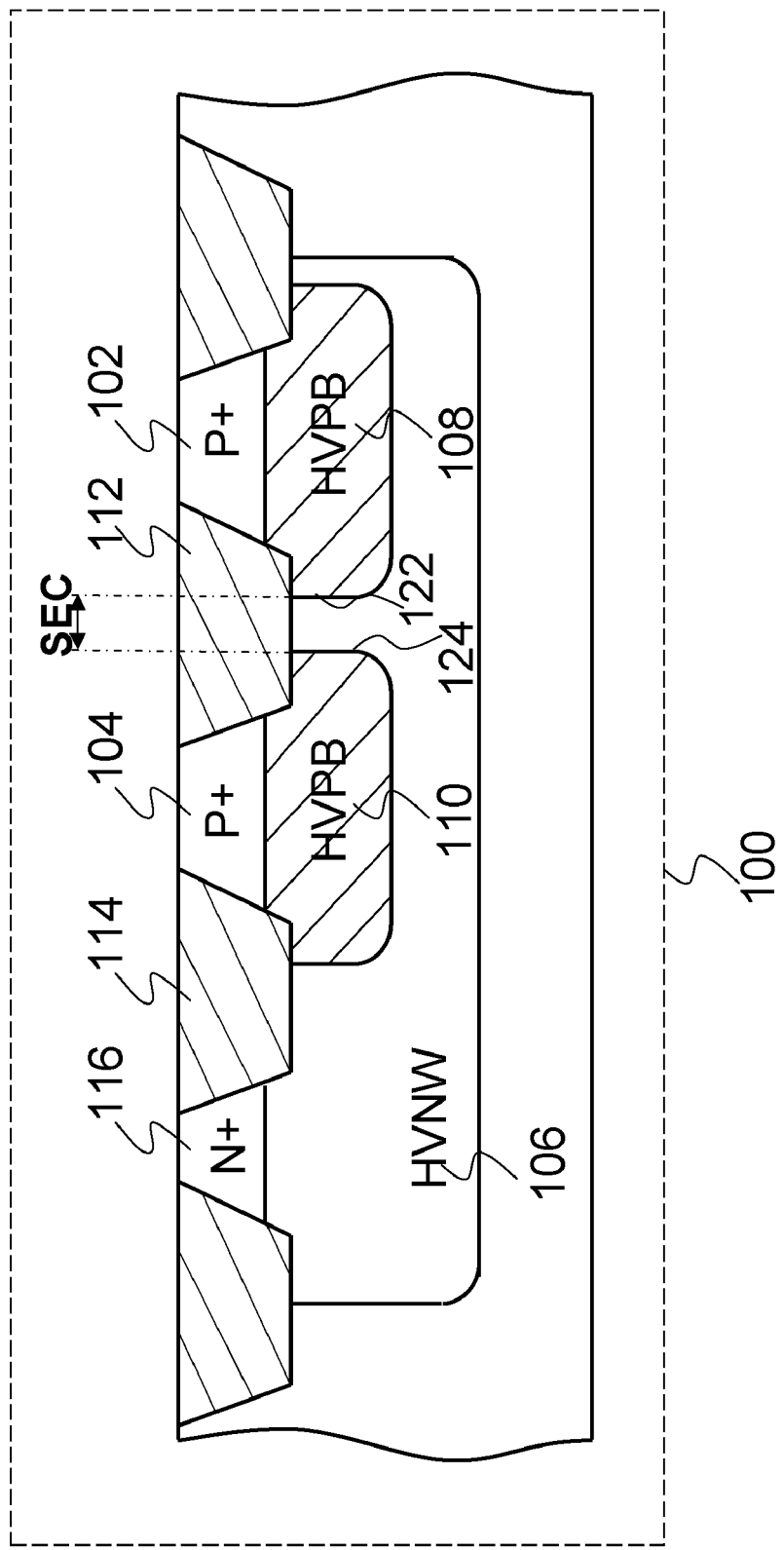
FIG. 1 illustrates a simplified cross-sectional view of an ESD protection structure in accordance with an embodiment.

FIG. 1 illustrates a simplified cross-sectional view of an ESD protection structure 100 in accordance with an embodiment. The ESD protection structure 100 includes a first P+ region 102, a second P+ region 104, a N+ region 116, a first isolation region 112, a second isolation region 114, a first high voltage P type implanted region 108, a second high voltage P type implanted region 110 and a High Voltage N Well (HVNW) 106. The HVNW 106 is formed by implanting doping materials into the substrate. For example, phosphor may be implanted to a doping density of about $10^{15}/cm^3$ to $10^{16}/cm^3$. The first high voltage P type implanted region 108 and the first P+ region 102 are sequentially disposed on the HVNW 106. The first high voltage P type implanted region 108 is disposed below the first P+ region 102. In accordance with an embodiment, after the doping, the first high voltage P type implanted region 108 has a doping density of between about $10^{17}/cm^3$ and $10^{18}/cm^3$. Likewise, the second high voltage P type implanted region 110 and the second P+ region 104 are sequentially disposed on the HVNW 106. The second high voltage P type implanted region 110 is disposed below the second P+ region 104. In accordance with an embodiment, after the doping, the second high voltage P type implanted region 110 has a doping density of between about $10^{17}/cm^3$ and $10^{18}/cm^3$.

The first isolation region 112 and the second isolation region 114 are used to isolate active regions so as to prevent leakage current from flowing between adjacent active regions. The isolation region (e.g., 112) can be formed by various ways (e.g., thermally grown, deposited) and materials (e.g., silicon oxide, silicon nitride). In this embodiment, the first isolation region 112 and the second isolation region 114 may be fabricated by a surface trench isolation (STI) technique.

The N+ region 116 is disposed in the HVNW 106 at one side of the second P+ region 104. The N+ region 116 is separated from the second N+ region 104 by the second isolation region 114. The first P+ region 102 is separated from the second P+ region 104 by the first isolation region 112. The upper portion of first high voltage P type implanted region 108 and the upper portion of the second high voltage P type implanted region 110 are separated by the first isolation region 112. As shown in FIG. 1, the bottom portion of first high voltage P type implanted region 108 are separated from the bottom portion of the second high voltage P type implanted region 110 by the HVNW 106. The distance between the first high voltage P type implanted region 108 and the second high voltage P type implanted region 110 is designated SEC.

One skilled in the art will recognize that FIG. 1 illustrates an ideal profile as doped. The distance SEC may vary after subsequent diffusion processes. The distance SEC shown in FIG. 1 is used to illustrate the inventive aspects of the various embodiments. The present invention is not limited to any particular distance between two high voltage P type implanted regions.

In an embodiment, SEC is an adjustable parameter. As shown in FIG. 1, SEC represents the distance between two high voltage P type implanted regions, namely 108 and 110. More particularly, SEC is the distance from an edge 122 of the first high voltage P type implanted region 108 to an edge 124 of the second high voltage P type implanted region 110. In a semiconductor doping process, the doping material may be added via ion implantation. By controlling the doping range of a high voltage P type implanted region (e.g., 108), SEC may change accordingly. As discussed below with respect to FIG. 3, SEC helps to provide an adjustable threshold voltage of ESD protection.

It should be noted that the doping technique used in the previous example is selected purely for demonstration purposes and is not intended to limit the various embodiments of the present invention to any particular doping technique. One skilled in the art will recognize that alternate embodiment could be employed (such as employing the diffusion technique).

In FIG. 1, the ESD protection structure 100 provides an on-chip ESD protection solution. For ESD protection applications, the second P+ region 104 is typically coupled to an input/output (I/O) pad and the first P+ region 102 is typically coupled to a power supple VSS pad, which is typically grounded or coupled to a power supply. An advantageous feature of the described embodiment is that the adjustable threshold voltage of an ESD protection device allows different voltage ESD protection schemes derived from the same structure as illustrated in FIG. 1.

Figure 2:
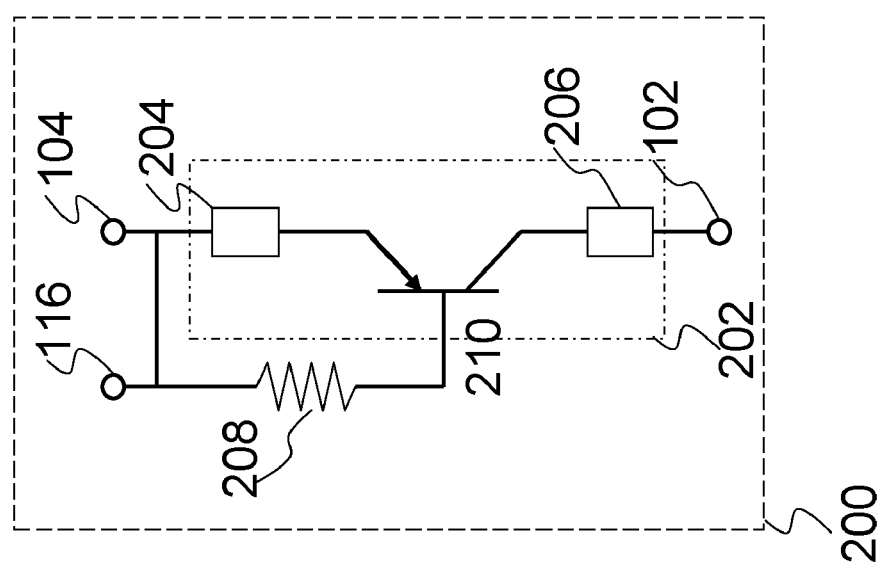
FIG. 2 illustrates an equivalent circuit diagram of the ESD protection structure illustrated in FIG. 1.

FIG. 2 illustrates an equivalent circuit diagram of the ESD protection structure 100 illustrated in FIG. 1. An equivalent circuit 200 of the ESD protection structure 100 illustrated in FIG. 1 includes a bipolar PNP transistor 202 having an emitter 204, a base 210 and a collector 206. The base 210 is coupled to the N+ region 116 through a resistor 206. The resistor 206 represents the parasitic resistance in the HVNW 106 (not shown but illustrated in FIG. 1). The emitter 204 is formed by the second P+ region 104 and the second high voltage P type implanted region 110. The collector 206 is formed by the first P+ region 102 and the first high voltage P type implanted region 108. Referring again to FIG. 1, the second high voltage P type implanted region 110 and the second P+ region 104 have the same conductivity type but different doping concentrations. The second high voltage P type implanted region 110 extends the second P+ region 104 to a deeper region. Likewise, the first high voltage P type implanted region 108 extends the first P+ region to a deeper region. The extensions of the emitter 204 and the collector 206 of the bipolar PNP transistor 202 result in a change of the breakdown voltage characteristic between the emitter 204 and the collector 206.

In sum, a simplified circuit diagram 200 depicts that the corresponding circuit of the ESD protection structure 100 constitutes one bipolar PNP transistor (e.g., 202), wherein both its emitter and collector are formed by a P+ region (e.g. 104) and a high voltage P type implanted region (e.g., 108) disposed underneath the P+ region. However, it should be recognized that while FIG. 2 illustrates the ESD protection circuit with one bipolar PNP transistor (e.g., PNP transistor 202), the ESD protection circuit could accommodate any numbers of bipolar PNP transistors. Furthermore, it is understood that the ESD protection circuit may be implemented using a plurality of bipolar PNP transistors in series connection. On the other hand, other configurations of a plurality of bipolar PNP transistors such as parallel-connected bipolar PNP transistors coupled to parallel-connected bipolar PNP transistors are also within the contemplated scope of this embodiment.

Figure 8:
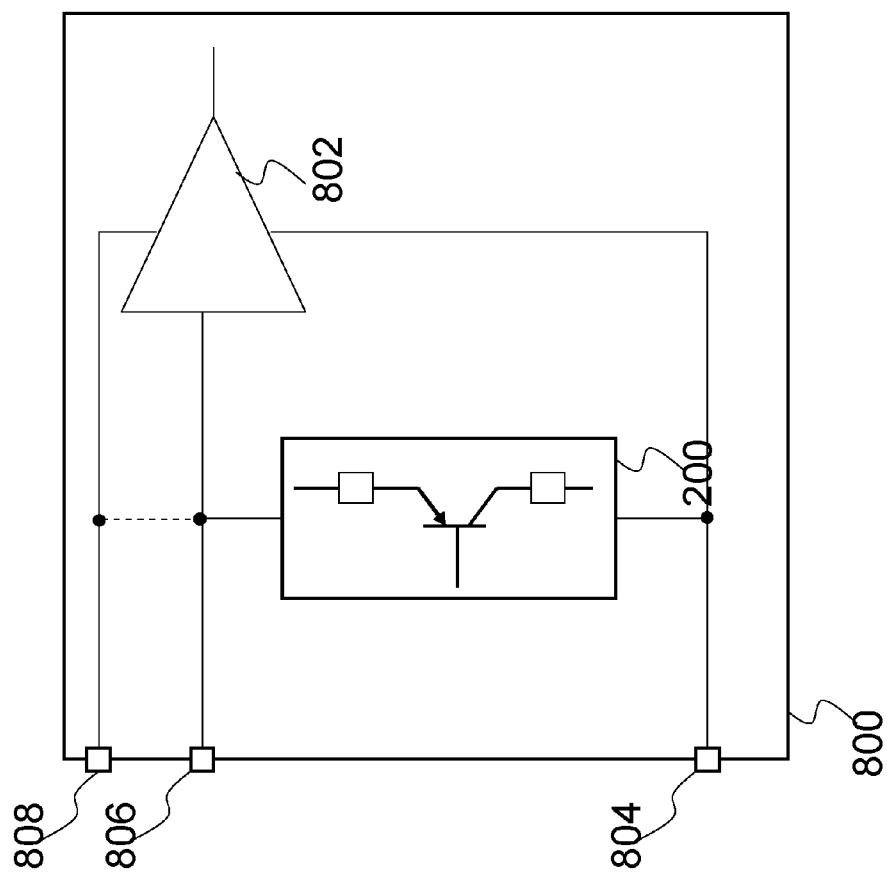
FIG. 8 illustrates an integrated circuit level ESD protection diagram.

The ESD protection circuit 200 is typically placed at an I/O pad and a VSS of a device to be protected (not shown but illustrated in FIG. 8). The second P+ region 104 is typically coupled to the I/O pad and the first P+ region 102 is typically coupled to the VSS, which is typically grounded or coupled to a power supply. If an ESD event occurs, a voltage spike is applied between the second P+ region 104 and the first P+ region 102. Consequently, the bipolar PNP transistor 202 experiences the voltage spike, which may exceed the bipolar PNP transistor 202's breakdown voltage. As a result, the bipolar PNP transistor 202 enters an avalanche conduction mode. As a consequence of the avalanche conduction, the bipolar PNP transistor provides a current path so that the ESD discharge current can flow from the emitter 204 to the collector 206. The conduction of the bipolar PNP 202 clamps the voltage between the emitter 204 and the collector 206 to a lower level so that the internal circuits coupled to the emitter 204 can be protected.

Referring again to FIG. 2, the base 210 is coupled to the emitter 204 through a resistor 208. In this embodiment, the resistor 208 represents the body resistance of the HVNW 106. It should be noted that the resistance between the base 210 and the emitter 204 may have an impact on the collector-emitter breakdown voltage of the bipolar PNP transistor 202. The direct connection between the N+ region 116 and the second P+ region 104 is provided for illustrative purpose only, and is provided only to provide an example of the functionality that may be included in this embodiment. One of ordinary of skill in the art will realize that in ESD protection applications, the N+ region 116 may be floating or coupled to the second P+ region 104 through an external resistor outside the ESD protection structure 100.

Figure 3:
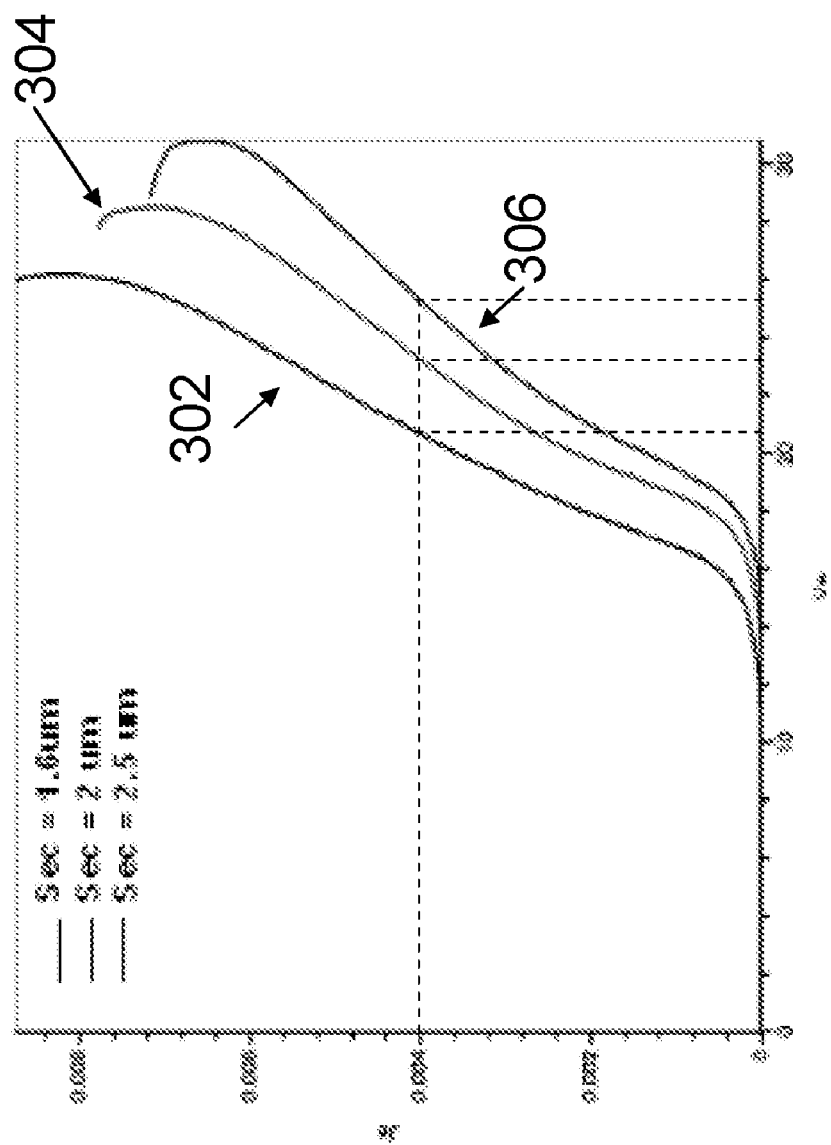
FIG. 3 illustrates I-V curves of the ESD protection circuit of FIG. 1 having different SEC values.

FIG. 3 shows three curves illustrating the current versus voltage characteristics of the ESD protection circuit 200 with different SEC values. The horizontal axis of FIG. 3 represents the ESD voltage across an ESD protection circuit (e.g., the ESD protection circuit 200). The vertical axis of FIG. 3 represents the ESD current flowing through the ESD protection circuit. A curve 302, a curve 304 and a curve 306 illustrate the currents flowing through the ESD protection circuit 200 having a SEC of 1.6 um, 2 um and 2.5 um respectively.

As shown in FIG. 3, the breakdown voltages for curves 302, 304 and 306 are quite similar (approximately 15V). Once the applied ESD voltage exceeds the breakdown voltage, three ESD currents increase in proportion to the applied ESD voltage. However, at the same ESD current level, a different SEC value causes the ESD protection circuit 200 to have a different holding voltage. For example, when the ESD protection circuit 200 having a SEC of 1.6 um (illustrated by curve 302) provides an ESD current of 0.004, the corresponding holding voltage is slightly over 20V. By contrast, with the same ESD current level, the ESD protection circuit 200 having a SEC of 2.5 um (illustrated by curve 306) has a holding voltage of about 23V. Similarly, when the ESD protection circuit 200 has a SEC of 2 um, the curve 304 illustrates the hold voltage is about 21.5V.

FIG. 3 shows an ESD protection device based upon the ESD protection structure 100 can have different holding voltages by selecting different values of SEC. An increase of SEC results in a proportional increase of the corresponding holding voltage. As such, an advantageous feature of this embodiment is that semiconductor devices having different voltage ratings (e.g., 20V, 30V, 40V) may be fabricated based upon the same basic structure by selecting different values of SEC.

Figure 4:
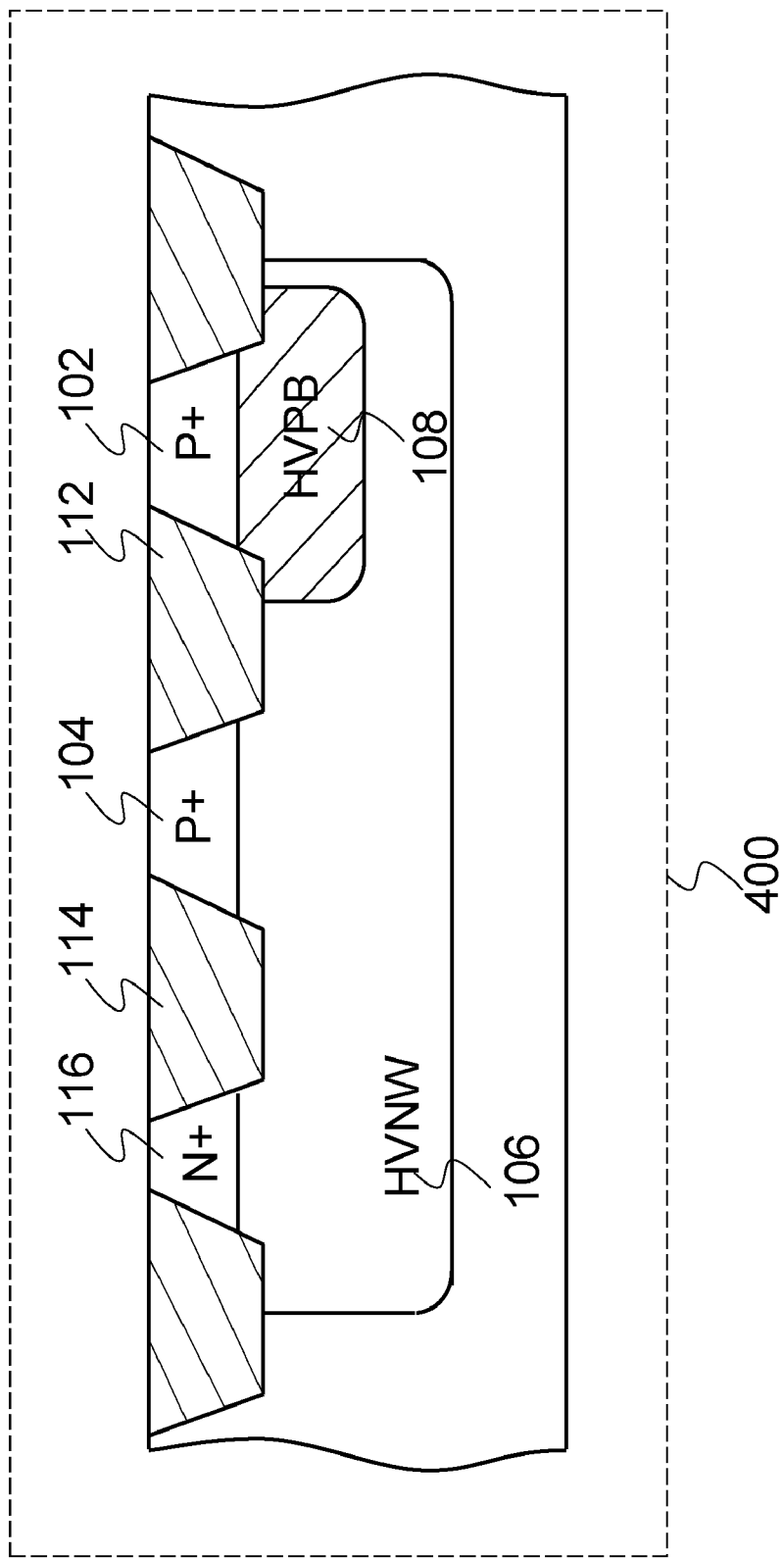
FIG. 4 illustrates a simplified cross-sectional view of an ESD protection structure in accordance with an alternate embodiment.

FIG. 4 illustrates a simplified cross-sectional view of an ESD protection structure 400 in accordance with an alternate embodiment. As shown in FIG. 4, the first high voltage P type implanted region 108 is disposed below the first P+ region 102. However, the second high voltage P type implanted region 110 is not disposed in the ESD protection structure 400. The first high voltage P type implanted region 108 has the same conductivity type as the first P+ region 102, so that the first high voltage P type implanted region 108 may extend the first P+ region 102 into a deeper level. This helps to provide a different holding voltage characteristic different from a conventional bipolar PNP transistor.

Figure 5:
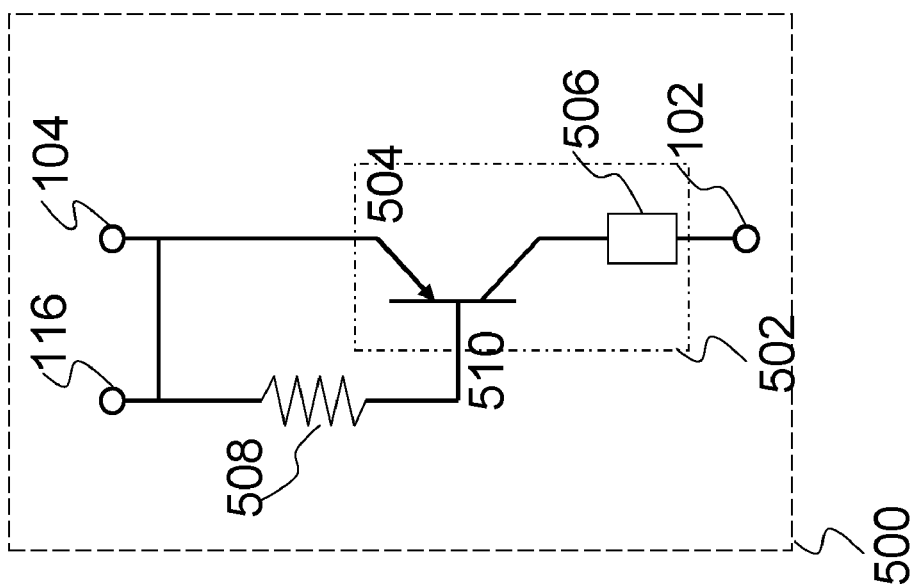
FIG. 5 illustrates an equivalent circuit diagram of the ESD protection structure illustrated in FIG. 4.

FIG. 5 illustrates an equivalent circuit diagram of the ESD protection structure 400 illustrated in FIG. 4. An ESD protection circuit 500 includes a bipolar PNP transistor 502 having an emitter 504, a base 510, a collector 506 and a resistor 508. As shown in FIG. 4, the first high voltage P type implanted region 108 and the first P+ region 102 form the collector 506. The emitter 504 is formed by the second P+ region 104. The resistor 508 represents the parasitic resistance in the HVNW 106 (not shown but illustrated in FIG. 4). Similar to the ESD protection circuit 200 described with respect to FIG. 2, the ESD protection circuit 500 can provide an ESD current path once the voltage across the emitter 504 and the collector 506 exceeds the breakdown voltage of the bipolar PNP transistor 502.

Figure 6:
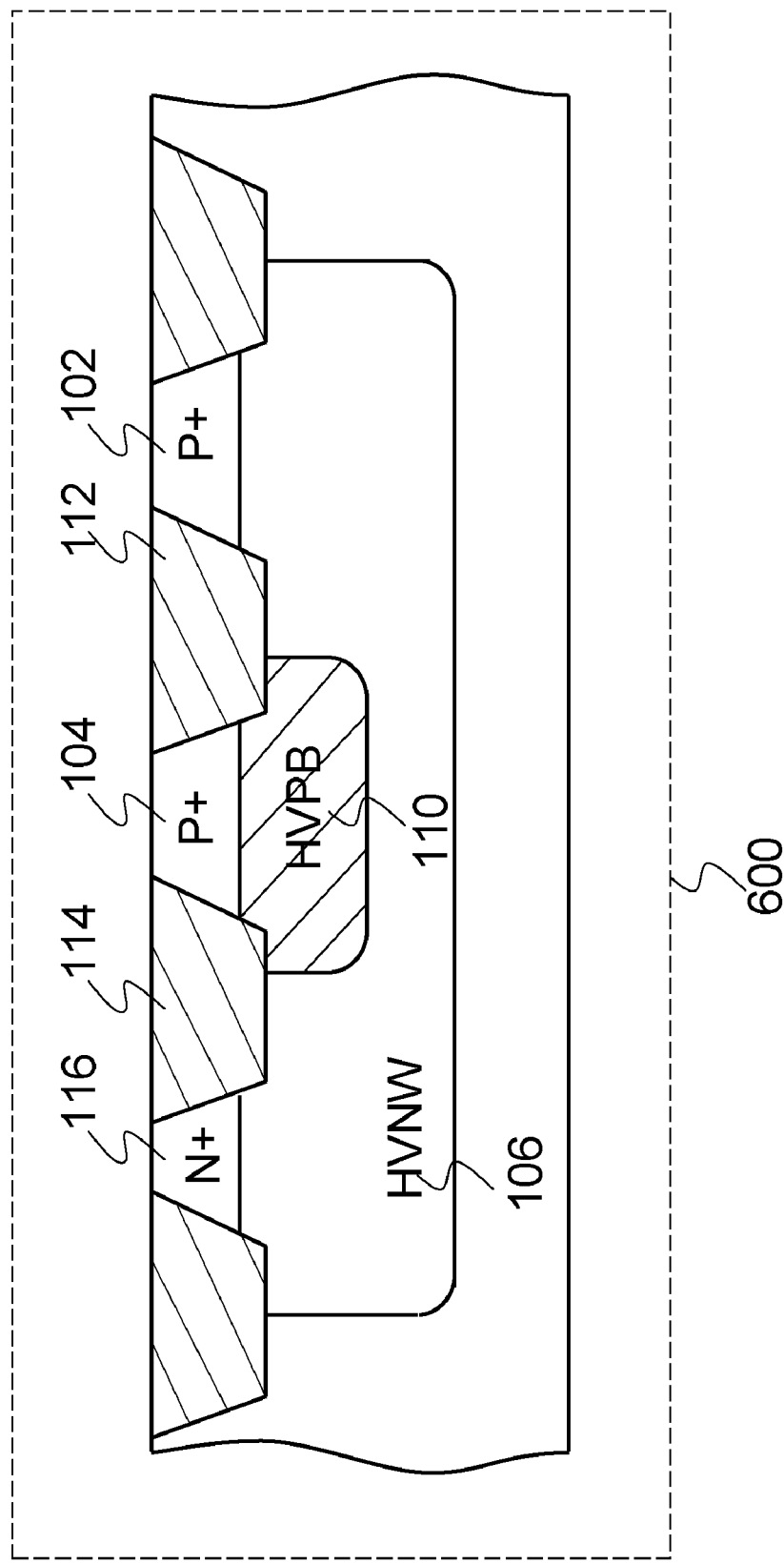
FIG. 6 illustrates a simplified cross-sectional view of an ESD protection structure in accordance with another embodiment.

FIG. 6 illustrates a simplified cross-sectional view of an ESD protection structure 600 in accordance with another embodiment. As shown in FIG. 6, the second high voltage P type implanted region 110 is disposed below the second P+ region 104. However, the first high voltage P type implanted region 108 is not disposed in the ESD protection structure 600. The second high voltage P type implanted region 110 has the same conductivity type as the second P+ region 104, so that the second high voltage P type implanted region 110 may extend the second P+ region 104 into a deeper level. This helps to provide an ESD current path having a different characteristic from the conventional PNP transistor.

Figure 7:
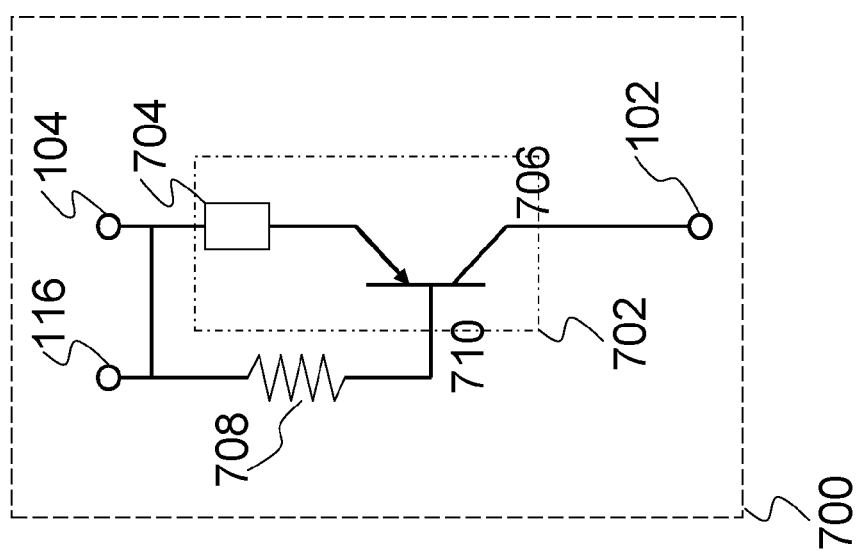
FIG. 7 illustrates an equivalent circuit diagram of the ESD protection structure illustrated in FIG. 6.

FIG. 7 illustrates an equivalent circuit diagram of the ESD protection structure 600 illustrated in FIG. 6. An ESD protection circuit 700 includes a bipolar PNP transistor 702 having an emitter 704, a base 710, a collector 706 and a resistor 708. As shown in FIG. 6, the second high voltage P type implanted region 110 and the second P+ region 104 form the emitter 704. The collector 706 is formed by the first P+ region 102. The resistor 708 represents the parasitic resistance in the HVNW 106 (not shown but illustrated in FIG. 6). Similar to the ESD protection circuit 200 described with respect to FIG. 2, the ESD protection circuit 700 can provide an ESD current path once the voltage across the emitter 704 and the collector 706 exceeds the breakdown voltage of the bipolar PNP transistor 702.

FIG. 8 illustrates an integrated circuit level ESD protection diagram. An integrated circuit chip 800 has a VDD pad 808, an I/O pad 806 and a VSS pad 804. Internal circuits 802 are coupled to the VDD pad 808 and VSS pad 804. The internal circuits 802 further include an input coupled to the I/O pad 806. The ESD protection circuit 200 is coupled between the I/O pad 806 and the VSS pad 804. It should be noted that the ESD protection circuit 200 is provided for illustrative purpose only. The ESD protection circuit between the I/O pad 806 and the VSS pad 804 may be any of the ESD protection circuits 200, 500 and 700 shown in FIG. 2, FIG. 5 and FIG. 7 respectively.

When an ESD event occurs between the I/O pad 806 and the VSS pad 804, the ESD protection circuit 200 conducts the ESD current, and the turn-on of an ESD protection circuit (e.g., the ESD protection circuit 200) clamps the voltage between the I/O pad 806 and the VSS pad 804 below the maximum voltage to which the internal circuits 802 are specified, so that the internal circuits 802 coupled between the I/O pad 706 and the VSS pad 705 are protected. An advantageous feature of the described circuit level ESD protection is the ESD protection circuit provides a bypass for ESD current to flow so that the internal circuits are protected.

It should be noted that the ESD protection circuit 200 may be coupled between the VDD pad 808 and the VSS pad 804 as indicated by the dashed line in FIG. 8. When an ESD event occurs between the VDD pad 808 and the VSS pad 804, the conduction of the ESD protection circuit clamps the voltage between the VDD pad 808 and the VSS pad 804, so that the internal circuits such as internal circuits 802 are protected. In short, the connection of the ESD device 200 in FIG. 8 is merely an example, which should not unduly limit the scope of the claims. One skilled in the art will recognize many variations, alternatives, and modifications.

FIG. 9 illustrates a further ESD protection scheme by employing a plurality of ESD protection circuits in series connection between an I/O pad and a VSS pad. Similar to FIG. 8, FIG. 9 includes an integrated circuit 800, a VDD pad 808, an I/O pad 806, a VSS pad 804 and internal circuits 802. However, FIG. 8 further includes a series connection of ESD protection circuits electrically coupled to the I/O pad 806 and the VSS pad 804. In high voltage applications, a single ESD protection circuit such as the ESD protection circuit 200 shown in FIG. 8 may not provide a reliable ESD protection. By contrast, a plurality of ESD protection circuits 200 in series connection may provide an adjustable ESD protection breakdown point as well as an adjustable ESD protection holding voltage.

In FIG. 9, if an ESD event occurs, a voltage spike is applied between the I/O pad 806 and the VSS pad 804. The series-connected ESD protection circuits may turn on nearly simultaneously. Each ESD protection circuit provides an ESD protection holding voltage. The sum of all series-connected ESD protection circuits' breakdown voltages clamps the I/O pad's voltage 806 to a level below the maximum rating voltage of the internal circuits 802, so that the internal circuits 802 are protected.

As described above with respect to FIG. 8, placing an ESD device between the I/O pad 806 and the VSS pad 804 in FIG. 9 is merely an example. One skilled in the art will recognize many variations, alternatives, and modifications, such as connecting the ESD device between the VDD pad 808 and the VSS pad 804 as indicated by the dashed line in FIG. 9.

In the embodiments, by controlling the distance between two high voltage P type implanted regions, the ESD protection device can have an adjustable threshold voltage for ESD protection. The ESD protection circuit provides a flexible ESD protection solution for semiconductor devices having different voltage ratings.

In accordance with an embodiment, an ESD protection device has a bipolar PNP transistor having an emitter formed by a first high voltage P type implanted region and a first P+ region disposed on the first high voltage P type implanted region, and a collector formed by a second high voltage P type implanted region and a second P+ region disposed on the second high voltage P type implanted region. The distance between the first high voltage P type implanted region and the second high voltage P type implanted region is SEC. The holding voltage of the ESD protection device can be adjusted by selecting different values of SEC.

In accordance with one variation of the embodiment described above, an ESD protection device has a bipolar PNP transistor having an emitter formed by a first high voltage P type implanted region and a first P+ region disposed on the first high voltage P type implanted region, and a collector formed by a second P+ region.

In accordance with another variation of the embodiment described above, an ESD protection device has a bipolar PNP transistor having an emitter formed by a first P+ region disposed and a collector formed by a high voltage P type implanted region and a second P+ region disposed on the high voltage P type implanted region.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An electrostatic discharge (ESD) protection device comprising:
   a bipolar PNP transistor comprising:
      an emitter formed by a first high voltage P type region and a first P+ region disposed on the first high voltage P type region; and
      a collector formed by a second high voltage P type region and a second P+ region disposed on the second high voltage P type region.

2. The device of claim 1, wherein the first high voltage P type region is disposed below a first isolation region.

3. The device of claim 1, wherein the second high voltage P type region is disposed below the first isolation region.

4. The device of claim 1, wherein the first high voltage P type region is separated from the second high voltage P type region by a high voltage N well region.

5. The device of claim 1, wherein the bipolar PNP transistor has a base, which is either floating or electrically coupled to the emitter.

6. The device of claim 1, wherein a distance between the first high voltage P type region and the second high voltage P type region is between 1 um to 10 um.

7. The device of claim 1, wherein the first high voltage P type region has a doping density of from $10^{17}/cm^3$ to $10^{18}/cm^3$.

8. An ESD protection structure comprising:
   a high voltage N well;
   a first high voltage P type region disposed on the high voltage N well;
   a first P+ region disposed on the first high voltage P type region;
   a second P+ region disposed adjacent to the first P+ region; and
   a N+ region disposed on the high voltage N well.

9. The structure of claim 8, wherein the first P+ region is separated from the second P+ region by a first isolation region.

10. The structure of claim 8 further comprising a second high voltage P type region disposed on the high voltage N well.

11. The structure of claim 8, wherein the first high voltage P type region has a doping density of from $10^{17}/cm^3$ to $10^{18}/cm^3$.

12. The structure of claim 8, wherein the second P+ region is disposed on the second high voltage P type region.

13. The structure of claim 8, wherein the first P+ region forms an emitter of a bipolar PNP transistor.

14. The structure of claim 8, wherein the first P+ region and the first high voltage P type region form the emitter of the bipolar PNP transistor.

15. The structure of claim 8, wherein the second P+ region forms a collector of a bipolar PNP transistor.

16. The structure of claim 10, wherein the second P+ region and the second high voltage P type region form the emitter of the bipolar PNP transistor.

17. A semiconductor chip comprising:
   a bipolar PNP transistor comprising:
      an emitter formed by a first high voltage P type region and a first P+ region disposed on the first high voltage P type region; and
      a collector formed by a second high voltage P type region and a second P+ region disposed on the second high voltage P type region;
   a first pad electrically coupled to the emitter of the bipolar PNP transistor; and
   a second pad electrically coupled to the collector of the bipolar PNP transistor.

18. The chip of claim 17 further comprising a plurality of circuits having a first terminal electrically coupled to the first pad and having a second terminal electrically coupled to the second pad.

19. The chip of claim 17, wherein the second pad is tied to ground.

20. The chip of claim 17 further comprising a plurality of bipolar PNP transistors in series connection electrically coupled between the first pad and the second pad.

* * * * *